United States Patent [19]
Kim et al.

[11] 3,846,645
[45] Nov. 5, 1974

[54] BI-POLAR PULSE GENERATOR

[75] Inventors: Robert H. Kim, Seoul, South Korea; Lawrence D. White, Bethesda, Md.

[73] Assignee: Westinghouse Electric Corporation, Pittsburgh, Pa.

[22] Filed: Oct. 17, 1973

[21] Appl. No.: 407,010

[52] U.S. Cl. .................. 307/260, 307/261, 307/262, 307/264, 307/265, 328/57, 328/58, 328/187
[51] Int. Cl. .......................... H03k 4/00, H03k 5/04
[58] Field of Search ........... 307/260, 261, 262, 264, 307/265, 266, 268; 328/57, 58, 187

[56] References Cited

UNITED STATES PATENTS 2,497,965 2/1970 Usselman ............................ 328/57
3,312,837 4/1967 Flynn et al. ..................... 328/187 X
3,781,689 12/1973 Marshall et al. ................. 328/57 X

*Primary Examiner*—John Zazworsky
*Attorney, Agent, or Firm*—J. B. Hinson

[57] ABSTRACT

A unitary solid state pulse generator of a bi-polar waveform having means for individually varying the amplitude of both the positive and the negative portions of the waveform as well as the bi-polar pulse repetition rate, the waveform baseline and the trailing edge of the positive portion of the output waveform thus providing a multi-variable waveform generator obviating the need for two separate generators or a double pulse generator.

11 Claims, 3 Drawing Figures

BI-POLAR PULSE GENERATOR

BACKGROUND OF THE INVENTION

1. Field of the Invention

This invention relates generally to waveform generating apparatus and more particularly to a bipolar square wave generator having selective control of the waveform parameters.

2. Description of the Prior Art

Where there existed a need for a bi-polar signal exhibiting sharp rise and fall times with the signal having a variable frequency with the amplitude of the positive and negative portions as well as a zero level baseline, also being variable, one normally resorted to the use of two separate generators; however, generally unreliable results were obtained due to jitter between the combined signals and generator loading as well as the lack of stabilization on the forward portion of the slopes of both the positive and negative portions of the composite output waveform.

SUMMARY

Briefly, the subject invention is directed to a multi-variable bi-polar waveform generator including a waveform source of a predetermined variable frequency feeding into a circuit for equally offsetting the waveform on either side of a point of reference potential, e.g., ground, and thereby provide an intermediate bi-polar waveform. This bi-polar waveform is next fed into circuit means for generating a bi-polar square wave which is then coupled to a bi-polar output amplifier. The positive portion of the bi-polar square wave is fed to and initiates operation of control circuitry for selectively terminating the half cycle period of the positive portion of the bi-polar square wave fed to the output amplifier. Additionally, circuit means intercouple the last mentioned control circuitry and the input of the output amplifier for selectively varying the baseline of the waveform applied to the input of the output amplifier above and below ground potential. The negative portion of the bi-polar waveform deactivates the control circuitry and is fed to the input of the output amplifier following the variable positive pulsewidth portion thereby providing a unitary output bi-polar waveform having a variable positive pulsewidth and a constant negative pulsewidth. The output amplifier additionally includes means for individually adjusting the amplitude of both the positive and negative portions of the bi-polar waveform appearing at the output of the output amplifier.

DESCRIPTION OF THE PREFERRED EMBODIMENT

Figures 1, 2, 3:
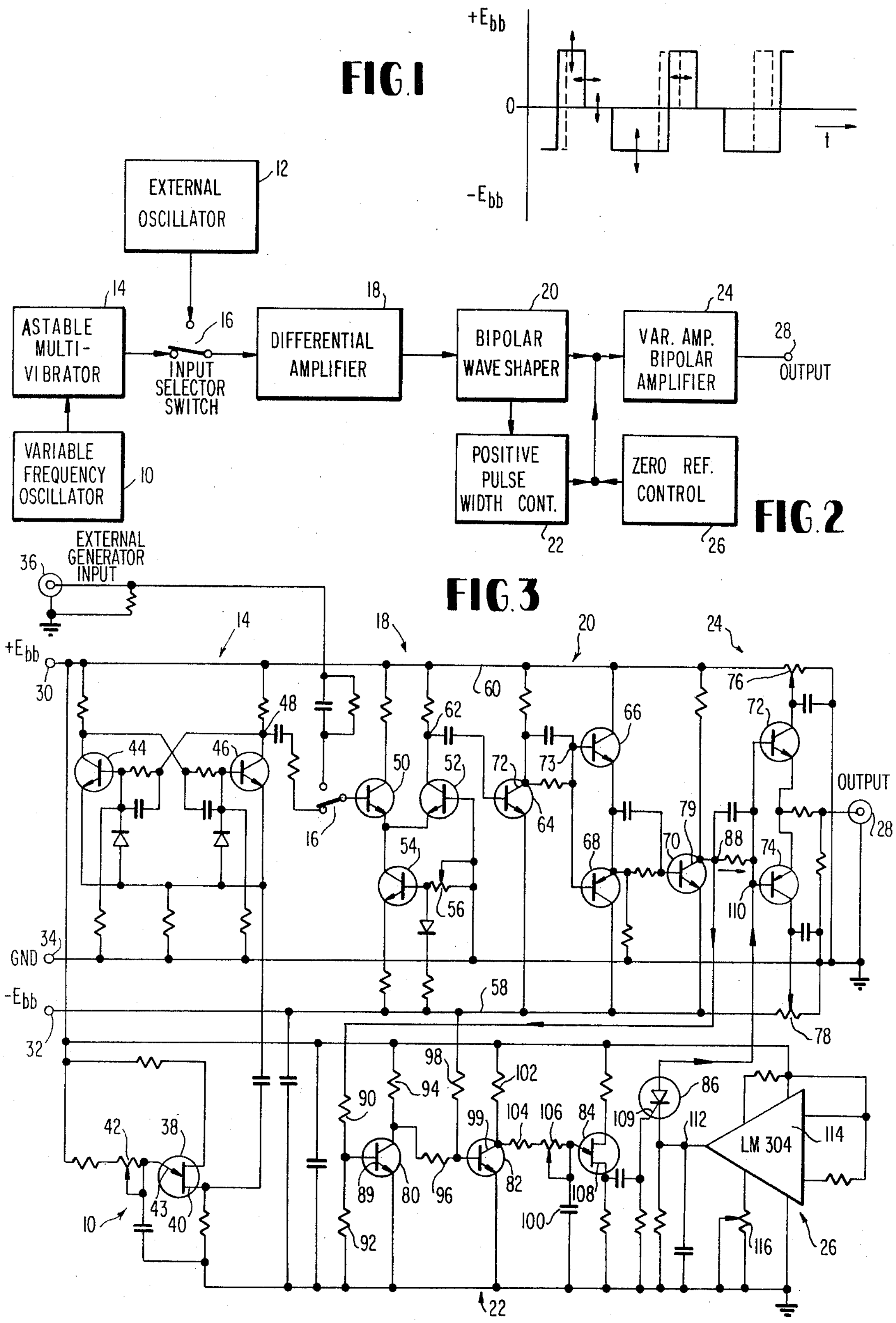
FIG. 1 is a graphical illustration of the type of bi-polar output signal generated by the subject invention.
FIG. 2 is a block diagram illustrative of the preferred embodiment of the subject invention.
FIG. 3 is an electrical schematic circuit diagram of the preferred embodiment of the subject invention.

Referring now to the drawings and more particularly to FIG. 1, there is disclosed the type of waveform which the subject invention is adapted to generate. The waveform comprises a bi-polar (both positive and negative polarity portions) signal having a variable amplitude of both the positive and negative portions of the waveform with the pulsewidth and more particularly the trailing edge of the positive half cycle portion also being selectively variable. The pulsewidth of the negative portion of the waveform is held constant; however, the baseline of the output waveform is also adapted to be made variable above and below a zero potential level. Finally it is desirable that the frequency for the pulse repetition rate of the bi-polar square wave output signal also be made variable. To this end the subject invention takes the form of electronic circuitry shown in FIGS. 2 and 3. The block diagram shown in FIG. 2 discloses an internal or local variable frequency source comprising an oscillator 10 and an external or remote source comprising the oscillator 12. The variable frequency oscillator 10 is coupled to and drives an astable multivibrator 14 which provides a generally unipolar square wave periodic waveform signal, that is one having its leading edge starting from a predetermined baseline. The external oscillator 12, on the other hand, may comprise either a sinusoidal or square wave periodic waveform generator of either variable or fixed frequency. An input signal selector switch 16 is adapted too couple a selected input waveform from either the external oscillator 12 or the multivibrator 14 to a differential amplifier 18 which operates to form a bi-polar signal from the input signal applied thereto. The output of the differential amplifier 18 is coupled into a bi-polar wave shaping circuit 20 which is adapted to steepen the leading and trailing edges of a square wave input or form a bi-polar square wave from a sinusoidal input signal. The output of the wave shaper circuit 20 is commonly fed to a control circuit 22 which operates to vary the width of the positive half-cycle portion of the bi-polar waveform and to an output amplifier 24 having means for adjusting both the positive and negative portions of the bi-polar output waveform. The control circuitry 22 selectively terminates the half cycle period of the positive portion of the bi-polar waveform fed to the input of the output amplifier 24 together with a baseline control afforded by means of a zero reference control circuit 26. The leading edge of the negative going waveform portion renders the control circuit 22 inoperative. A multi-variable bi-polar output waveform such as shown in FIG. 1 thus appears at output terminal 28.

Considering now the preferred embodiment of the invention in still greater detail, attention is now directed to the electrical schematic diagram shown in FIG. 3. The bi-polar output waveform shown in FIG. 1 is adapted to have an amplitude varying between power supply voltages $+E_{bb}$ and $-E_{bb}$ respectively connected to terminals 30 and 32 from respective sources, not shown. A zero voltage reference hereinafter referred to as ground potential is connected to terminal 34. An external generator input terminal 36 is provided for the connection of an external frequency source such as the oscillator 12 illustrated in FIG. 2.

The variable frequency oscillator 10 (FIG. 2) comprises a free running unijunction oscillator including the unijunction transistor 38. Such a circuit is well known to those skilled in the art, being adapted to provide a regularly recurring waveform at one of the base electrodes 40. The variable resistance 42 coupled to the emitter 43 provides a means for adjusting the frequency of the free-running oscillator 10. The output of the oscillator 10 is capacitively coupled to an astable multivibrator 14 which includes two junction type transistors 44 and 46. It should be noted that the multivibrator circuit 14 is coupled between the supply voltage $+E_{bb}$ and ground. Thus a positive unipolar square wave signal appears at circuit junction 48 which is common to the collector of transistor 46. The unipolar square wave signal from the multi-vibrator 14 is capacitively coupled to the input signal switch 16. The switch is also capacitively coupled to the external generator input terminal 36.

Depending upon the position of the switch 16, either an internally generated unipolar square wave signal generated by the multi-vibrator 14 or an externally generated input signal is coupled to one input of the differential amplifier 18 comprised of transistors 50, 52 and 54. The base of transistor 50 is directly connected to the unipolar input signal while transistor 52 has its base connected to ground. Transistor 54 and the variable resistor 56 acts as a precision current source for transistors 50 and 52 such that the input signal applied to the base of transistor 50 is adapted to provide an intermediate bi-polar output signal that swings between $+E_{bb}$ and $-E_{bb}$ due to the return of the emitter of transistor 54 to the negative $(-E_{bb})$ supply buss 58. The collectors of transistors 50 and 52 are coupled to the positive $(+E_{bb})$ supply buss 60.

Accordingly, a bi-polar signal, that is one having both positive and negative polarity portions, appears at circuit junction 62. This bi-polar waveform is capacitively coupled to transistor 64 which forms part of the bi-polar wave shaping circuit 20 shown in FIG. 2. The additional circuitry includes transistors 66, 68 and 70. Transistor 64 comprises a first buffer amplifier stage whereas transistors 66 and 68 are adapted to respectively operate on the positive and negative portions of the bi-polar waveform when it appears at the collector 72 of transistor 64 and at the common junction 73. For example, the positive portion of the bi-polar waveform will operate to drive transistor 66 on, i.e., conductive into saturation and then to non-conduction which acts to respectively steepen the leading and trailing edges of the positive portion of the waveform whereas transistor 68 is adapted to be driven into saturation and then to non-conduction by the negative portion of the bi-polar waveform and also acts to respectively steepen the negative leading and trailing edges of the waveform. The signal appearing at the base of transistor 70 is thus a well defined square wave which is symmetrical, i.e., having equal positive and negative pulsewidth portions above and below a zero or ground voltage baseline. Transistor 70 acts as a second buffer amplifier whose collector is coupled to a bi-polar output amplifier 24 comprised of transistors 72 and 74 which have their respective collectors connected to the resistive potentiometers 76 and 78. These potentiometers are adapted to set the amplitude of the positive and negative portions of the bi-polar output signal and thus providing selected amplitude control.

Variation of the pulsewidth, i.e., the trailing edge of the positive polarity portion of the bi-polar waveform which appears at the collector 79 of the buffer amplifier 70 is accomplished by means of the control circuitry 22 including the transistors 80, 82, the unijunction transistor 84 and the controlled rectifier (SCR) 86. The base of transistor 80 is coupled to circuit junction 88 which is common to the collector 79 of transistor 70 by means of the resistance voltage divider network including the resistors 90 and 92. Transistor 80 is biased such that it is normally nonconducting, i.e., off while transistor 82 is biased on by means of the resistors 94, 96 and 98. The conduction of transistor 82 is adapted to maintain unijunction transistor 84 inoperative due to its emitter electrode being coupled to the collector 99 of transistor 82.

As noted before, a symmetrical bi-polar signal appears at the collector output of transistor 70. The positive portion of the bi-polar signal which appears at the collector 79 of transistor 70 and circuit junction 88 when it appears at the base 89 of transistor 80 causes it to become conductive and in turn renders transistor 82 non-conductive. The non-conductive or OFF state of transistor 82 causes capacitor 100 to charge towards the positive supply potential $+E_{bb}$ through the resistors 102, 104 and 106. In accordance with the RC time constant of elements 100–106 capacitor 100 will accumulate a sufficient charge after a predetermined time delay to cause the unijunction transistor 84 to fire and generate a positive pulse at its base electrode 108. This pulse is capacitively coupled to the gate 109 of the SCR 86 which is driven into conduction. With the SCR 86 on, the anode-to-cathode voltage drop is that of a forward biased diode, and hence the potential at the circuit junction 110, which is the input to the bi-polar output amplifier 24, immediately drops to substantially the voltage appearing at circuit junction 112 which is the output of an operational amplifier 114, and thus terminating the positive pulsewidth portion of the bi-polar waveform. The operational amplifier 114 is adapted to be varied above or below ground potential by means of the variable resistor 116. Thus when the SCR 86 is triggered on, a baseline voltage is set by the voltage at junction 112 and thus at the base of transistors 72 and 74 of the bi-polar output amplifier notwithstanding the total width of the positive portion of the bi-polar waveform applied to the base of transistor 70.

At the time the negative going leading edge appears at circuit junction 88 it is coupled to the base of transistor 80 which renders it non-conductive. Accordingly, transistor 82 again becomes conductive and the unijunction transistor 84 is disabled and the SCR 86 is turned off. The negative portion of the bi-polar waveform at junction 88 is coupled to the output amplifier 24 and more particularly to the output transistor 74 which comprises an emitter follower which is responsive to the negative portion of the bi-polar output waveform and providing the output signal to output terminal 28. The preceding positive waveform portion was fed to the output amplifier 24 where it was fed to terminal 28 by means of the emitter follower formed by transistor 72.

Thus what has been shown and described is a relatively simple bi-polar signal generator comprised of semiconductor elements and having multiple variation of the output waveform characteristic. Just as importantly, it avoids the drawbacks of requiring two separate signal generators with the corresponding time jitter and loading problems that inherently exist when using two separate signal generators.

While the present embodiment has been shown and disclosed what is at present considered to be the preferred embodiment of the subject invention, it should be pointed out however that the present disclosure is set forth for purposes of illustration only and is not meant to be considered in a limiting sense, since it is desirable that all modifications, alterations, and variations coming within the scope of the following claims is meant to be included. Accordingly,

We claim as our invention:

1. A bi-polar signal generator providing an output having selectively variable waveform characteristics, comprising in combination:

a signal source generating a periodic waveform of a selected frequency;

first circuit means coupled to said signal source and being operable in response to said periodic waveform to provide a bi-polar waveform signal of said selected frequency;

second circuit means coupled to said first circuit means and being operable in response to said bi-polar waveform signal to provide a bi-polar square wave signal having positive and negative signal portions;

third circuit means coupled to said second circuit means and being responsive to the bi-polar square wave signal to provide a bi-polar output signal; and fourth circuit means coupled to said second and third circuit means and being operable in response to said positive signal portion of said bi-polar square wave signal to selectively vary the pulsewidth of the positive signal portion of said bi-polar output signal;

fifth circuit means coupled to said third and fourth circuit means and being operable in conjunction with said fourth circuit means to selectively vary the voltage amplitude of the waveform baseline existing intermediate said positive and negative signal portions of said bi-polar output signal when said positive signal portion is less than its maximum possible pulsewidth.

2. The bi-polar signal generator as defined by claim 1 wherein said third circuit means comprises a bi-polar signal amplifier circuit including circuit means being operable to selectively and independently vary the amplitude of said positive and negative signal portions of said composite bi-polar output signal.

3. The bi-polar signal generator as defined by claim 2 wherein said signal source comprises a variable frequency input signal source.

4. The signal generator as defined by claim 3 and additionally including an external input signal terminal and switch means selectively coupling said variable frequency input signal source and external input signal terminal to the input of said first circuit means.

5. The bi-polar signal generator as defined by claim 1 wherein said first circuit means comprises a differential amplifier being operable to provide said bi-polar waveform signal in response to said periodic waveform.

6. The bi-polar signal generator as defined by claim 1 wherein said second circuit means comprises buffer amplifier means coupled to said first circuit means;

a bi-polar signal amplifier coupled across a positive and negative supply potential and comprised of a first amplifier coupled to said positive supply potential and a second amplifier coupled to said negative supply potential, said first and second amplifiers having common input connection and a common output connection with said common input connection coupled to the output of said buffer amplifier means, and wherein said first amplifier is responsive to the positive portion of said bi-polar waveform signal to be rendered fully conductive thereby and said second amplifier is responsive to the negative portion of said bi-polar waveform signal to be rendered fully conductive thereby; anid second buffer amplifier means coupled to said common output connection between said amplifier for providing said bi-polar square wave waveform signal.

7. The bi-polar signal generator as defined by claim 1 wherein said fourth circuit means comprises:

time delay pulse generator means rendered operative by said positive signal portion of said bipolar square wave waveform signal to provide a trigger pulse after a predetermined time delay; and sixth circuit means coupled to the input of said third circuit means and being responsive to said trigger pulse and operated thereby to terminate the positive signal portion of said bi-polar square waveform signal applied to said third circuit means.

8. The bi-polar signal generator as defined by claim 7 wherein said time delay pulse generator means comprises:

a normally inoperative pulse generator;

a first transistor coupled to said pulse generator, being biased in a normally conductive state to hold said pulse generator inoperative;

a second transistor coupled to said first transistor and being biased in a normally non-conductive state and thereby maintain said first transistor conductive, said second transistor being coupled to said second circuit means and being rendered conductive by said positive signal portion of said bi-polar square wave waveform signal to render said first transistor non-conductive and operating said pulse generator.

9. The bi-polar signal generator as defined by claim 8 wherein said fifth circuit means comprises operational amplifier means having an output terminal providing a variable DC output potential; and wherein said sixth circuit means comprises controlled rectifier means having a pair of power electrodes and a gate electrode, and wherein one of said power electrodes is coupled to said output terminal of said operational amplifier, the other power electrode is coupled to the input of said third circuit means and said gate electrode is coupled to said pulse generator and being adapted to receive said trigger pulse after a predetermined time delay from the leading edge of said positive signal portion of said bi-polar square wave signal.

10. The bi-polar signal generator as defined by claim 9 wherein said third circuit means comprises first and second transistor emitter follower circuits having a common input connection and a common output connection, and wherein said first emitter follower circuit is responsive to the portion of said bi-polar square wave signal and said second emitter follower circuit is responsive to the negative of said bi-polar square wave signal.

11. The bi-polar signal generator as defined by claim 10 wherein said pulse generator comprises a unijunction transistor pulse oscillator.

* * * * *